United States Patent [19]
Toliver et al.

[11] Patent Number: 5,146,174
[45] Date of Patent: Sep. 8, 1992

[54] SWITCHING ARRANGEMENT METHOD AND APPARATUS FOR MAKING PARAMETER MEASUREMENT AND ADJUSTMENT OF COUPLED DUAL RESONATOR CRYSTALS USING BOTH RESONATOR PORTS

[75] Inventors: Samuel Toliver, Rustburg; Gerald E. Roberts; Myron A. Turner, Jr., both of Lynchburg, all of Va.

[73] Assignee: Ericsson GE Mobile Communications Inc., Lynchburg, Va.

[21] Appl. No.: 677,321

[22] Filed: Mar. 25, 1991

Related U.S. Application Data

[63] Continuation-in-part of Ser. No. 480,773, Feb. 16, 1990, Pat. No. 5,049,828, and a continuation-in-part of Ser. No. 480,774, Feb. 16, 1990, Pat. No. 5,047,726.

[51] Int. Cl.[5] ............................................. G01R 27/00
[52] U.S. Cl. ................................ 324/727; 324/652; 324/649
[58] Field of Search ............... 324/727, 652, 653, 80, 324/81, 649; 29/25, 35

[56] References Cited

U.S. PATENT DOCUMENTS

| | | | |
|---|---|---|---|
| 3,963,982 | 6/1976 | Roberts | 324/56 |
| 3,992,760 | 11/1976 | Roberts | 29/25.35 |
| 4,093,914 | 6/1978 | Peppiatt et al. | 324/56 |
| 4,433,316 | 2/1984 | Roberts et al. | 333/189 |
| 4,477,952 | 10/1984 | Creszenzi et al. | 29/25.35 |
| 4,484,158 | 11/1984 | Roberts et al. | 333/191 |
| 4,627,379 | 12/1986 | Roberts et al. | 118/721 |
| 4,676,993 | 6/1987 | Roberts et al. | 427/10 |
| 4,725,771 | 2/1988 | Sauerland | 324/56 |
| 4,733,164 | 3/1988 | Sauerland | 324/56 |
| 4,833,430 | 5/1989 | Roberts et al. | 333/191 |
| 4,839,618 | 6/1989 | Roberts et al. | 333/191 |

OTHER PUBLICATIONS

"A Four-Frequency Process for Accurately Measuring Coupled-Dual Resonator Crystals", Roberts, Proc. 33rd Ann. Symp. on Freq. Contr., May 1979, pp. 159–165.
"The Four-Frequency Process for Coupled Duals Using Error-Corrected S-Parameter Measurements", Roberts, IEEE Transactions on Ultrasonics, Ferroelectrics, and Frequency Control, vol. 35, No. 3, May 1988, pp. 306–314.

*Primary Examiner*—Jack B. Harvey
*Attorney, Agent, or Firm*—Nixon & Vanderhye

[57] ABSTRACT

A monolithic coupled-dual resonator crystal filter coupled to improve switching arrangements is tested using both resonator ports to quickly measure selected resonator parameters useful in frequency adjustment, production and test systems as well as accurately measuring other filter crystal parameters, all without requiring removal of the crystal structure from the test fixture.

16 Claims, 6 Drawing Sheets

TRUTH TABLE

| RELAY 2 | RELAY 4 | DISPLAY |
|---|---|---|
| 0 | 0 | F1 AND F3 |
| 0 | 1 | X |
| 1 | 0 | X |
| 1 | 1 | F2 AND F4 |
| | | |

1=ENERGIZED
0=DE-ENERGIZED
X=UNWANTED STATE

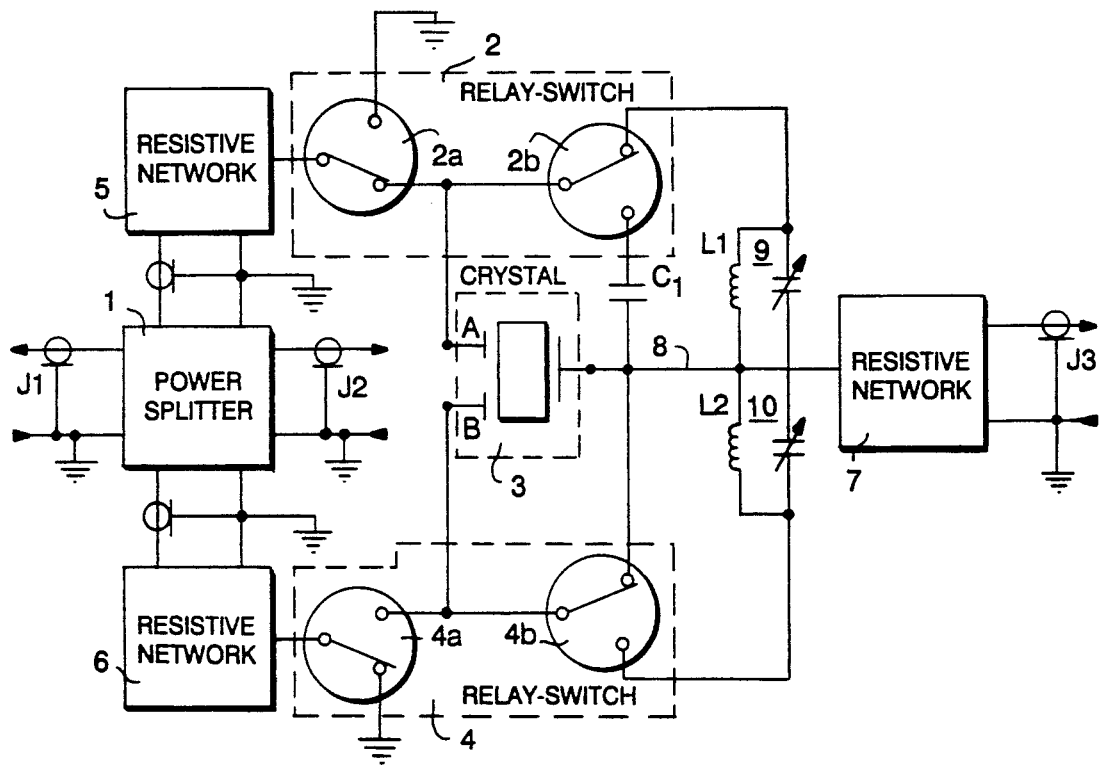

TRUTH TABLE

| RELAY 2 | RELAY 4 | FUNCTION |
|---|---|---|
| 0 | 0 | DISPLAY F1 AND F3 |
| 0 | 1 | X |
| 1 | 0 | X |
| 1 | 1 | DISPLAY F2 AND F4 |

SWITCHING ARRANGEMENT METHOD AND APPARATUS FOR MAKING PARAMETER MEASUREMENT AND ADJUSTMENT OF COUPLED DUAL RESONATOR CRYSTALS USING BOTH RESONATOR PORTS

CROSS REFERENCE TO RELATED APPLICATIONS

This application is a continuation-in-part of commonly-assigned copending application Ser. Nos. 07/480,773, now U.S. Pat. No. 5,049,828 issued Sept. 17, 1991 and 07/480,774 now U.S. Pat. No. 5,047,726 issued Sept. 10, 1991 of Toliver et al. and Roberts et al., respectively, both of which were filed on Feb. 16, 1990. The entire disclosures of these parent applications are expressly incorporated herein by reference.

BACKGROUND AND SUMMARY OF THE INVENTION

This invention is generally related to monolithic coupled-dual resonator crystals and in particular is directed to an improved method and apparatus for accurately measuring the characteristic frequencies of such crystals at any step in the manufacturing process following formation of the resonators.

The disclosed exemplary embodiments have particular utility in the frequency adjustment and testing of monolithic filter crystals. This disclosure is related to and is a continuation-in-part of two earlier applications, Ser. No. 07/480,773, now U.S. Pat. No. 5,049,828 entitled "Method and Apparatus for Parameter Measurement of Coupled-Dual Resonator Crystals" and Ser. No. 07/480,774, now U.S. Pat. No. 5,047,726 entitled "Method and Apparatus for Implementing the Four-Frequency Measuring Process for Coupled-Dual Crystals Using Both Resonator Ports", both filed Feb. 16, 1989.

As indicated in the above noted parent applications, monolithic filter crystal structures and theory of operation, as well as methods of making, testing and adjusting such structures, are well known. The following commonly assigned patents listed below are also generally related to such structure and/or methods.

U.S. Pat. No. 4,093,914—Peppiatt et al (1978)
U.S. Pat. No. 4,433,316—Roberts et al (1984)
U.S. Pat. No. 4,477,952—Crescenzi et al (1984)
U.S. Pat. No. 4,627,379—Roberts et al (1986)
U.S. Pat. No. 4,676,993—Roberts et al (1987)
U.S. Pat. No. 4,833,430—Roberts et al (1989)
U.S. Pat. No. 4,839,618—Roberts et al (1989)

Typically, a monolithic filter crystal is constructed as shown in FIGS. 1, 2A and 2B. It comprises multiple acoustically coupled resonators on a single crystal blank 12. A coupled-dual resonator has an input electrode 14, for example, and an output electrode 16, for example, on one face of the blank and common electrodes, 22, 24 on the opposite face of the blank with a first resonator formed by the input electrode 14 and the common electrode 22, and a second resonator formed by the output electrode 16 and common electrode 24.

FIGS. 2A and 2B show the active and ground sides of a mounted crystal. The ground side may or may not have a gap between the resonators as shown. The equivalent circuit of a typical coupled-dual resonator crystal is shown in FIG. 3.

Monolithic filter crystals are used extensively in the radio communication industry. Exemplary uses include IF filter and discriminator applications in mobile radios and cellular telephones.

In the manufacture of coupled-dual crystals, the major parameters under consideration are the two resonator frequencies and coupling. As indicated in commonly assigned U.S. Pat. No. 4,093,914, which is hereby incorporated by reference, accurate determination of these desired characteristics can be derived mathematically by means of a four-frequency measurement technique. The four frequencies are designated—F1, F2, F3 and F4.

Application Ser. No. 07/480,774 now U.S. Pat. No. 6,047,726, the disclosure of which is incorporated herein, details our discovery of the means of obtaining the four critical frequencies used in the calculation of the key crystal parameters wherein both ports of the coupled-dual crystal are monitored. The common method of displaying the four frequencies of interest is by inserting the crystal in a simple voltage divider type network in which the driving-point impedance whose phase zeros are to be measured is put in the series arm. This apparatus of the noted parent application is shown in FIG. 4.

In normal use, a frequency synthesizer is connected to J1, the reference probe (A) of a vector voltmeter is connected to J2, and the B probe is connected to J3. The first two frequencies, namely F1 and F3, as illustrated in FIG. 5A, are obtained by inserting the crystal with the B port in the series arm with switch S1 closed. Then a band of frequencies is applied at J1 until the B probe of the vector voltmeter indicates zero phase in the vicinity of the two specific maximum voltage amplitudes as also illustrated in FIG. 5A.

After measuring the values of F1 and F3, the crystal is removed and reinserted with the A port in the series arm and switch S1 opened. Frequencies F2 and F4, as illustrated in FIG. 5B, are obtained by using the frequency sweep technique previously described. A network analyzer such as a Hewlett Packard HP 3577A may also be used to obtain the four critical frequencies needed for parameter measurement by means of reflective measurement techniques. Such analyzers are two port measuring instruments which makes it easier and more convenient to switch between the various ports of the crystal as required by the reflective measurement techniques employed.

As may be seen from the above noted prior art, frequency adjustment of monolithic filter crystals is known and is achieved by various means. For example, the most noted adjustment method is a vacuum deposition process whereby silver, gold or other suitable material is deposited through a specially designed mask onto the electrode of the crystal. The deposited material produces a mass loading effect which causes the frequency of the crystal to decrease. Other techniques for frequency adjustment include mass addition by chemical action and mass removal by laser.

The methodology taught by Toliver, Roberts and Crescenzi in commonly assigned U.S. Pat. No. 4,696,993 discloses a method for frequency adjustment of coupled-duals by monitoring only one port and without using compensation on either port. This method worked well when the design of the crystal was such that the four critical frequencies always displayed zero phase crossings. However, in the development of unsymmetrical filters and/or filters at higher operating frequencies, we noticed that the measurement capability began to deteriorate. At still higher frequencies we noticed that measurement of the four critical frequencies using the conventional method and apparatus became unattainable, thus making accurate adjustment of the filter parameters impossible. U.S. patent application Ser. No. 07/480,773, now U.S. Pat. No. 5,049,828, discloses a single port measurement apparatus that solved this problem.

We have discovered a new method and apparatus which conveniently uses a new two-port measurement technique allowing not only coupled-dual crystal parameter measurements but accurate parameter adjustments as well. The exemplary embodiments disclosed exhibit a novel manner of implementing transmission or reflective two-port measuring techniques in production and test systems without requiring the removal of the crystal from the measurement fixture as in the case in 07/480,774, now U.S. Pat. No. 5,047,726. Such embodiments also allow implementing the two-port measurement method with the inclusion of compensation of the driving-point impedance of the filter, as well as using the compensated measuring techniques for selectively changing the plate mass distribution on a coupled-dual crystal to adjust the characteristic frequencies.

An important aspect of the known two-port measuring technique is that it allows measurement of the tuning frequency of each resonator, wherein the tuning frequency of either of the two resonators is the lower frequency of the two phase zeros of the input impedance to the resonator with the other resonator either open or short circuited to the common lead. A further object of our embodiments is to obtain a directly measurable response for each resonator which provides more flexibility when using the four-frequency measurement method for frequency adjustment. That is to say, during frequency adjustment where only moderate accuracy is required, in the interest of speed only the tuning frequencies need to be monitored.

In this regard, by monitoring only the tuning frequencies with our two-port embodiments, which may include selectively compensated driving-point impedance features, gross imbalances in the resonator frequencies can be more easily detected and resolved before the final frequency adjustment. Commonly assigned U.S. Pat. No. 4,676,993 discloses a method and apparatus for selectively fine tuning a coupled-dual resonator crystal in conjunction with the measuring technique taught by U.S. Pat. No. 4,093,914. Use of our two-port compensated or uncompensated embodiments for detecting the aforementioned gross imbalances allows considerable enhancement of the cited prior art fine tuning system in realizing desired filter characteristics.

Alternatively, when very accurate measurement of the filter crystal parameters, such as frequencies F1, F2, F3 and F4 are required, our embodiments can be converted to a four-frequency measurement technique with measurements made in the manner taught, for example, in application Ser. Nos. 07/480,773, now U.S. Pat. No. 5,049,828 or 07/480,774, now U.S. Pat. No. 5,047,726.

BRIEF DESCRIPTION OF THE DRAWINGS

These as well as other objects and advantages of this invention will be more clearly appreciated by carefully studying the following detailed description of a presently preferred exemplary embodiments of this invention in conjunction with the accompanying drawings in which:

FIG. 7 illustrates a second embodiment similar to the embodiment of FIG. 6 but additionally providing a tuned inductance for neutralizing the shunt capacitance of the driving point impedance of the filter;

FIG. 7A is a truth table relating to the operation of the apparatus of FIG. 7;

DETAILED DESCRIPTION OF THE INVENTION

Figure 1:
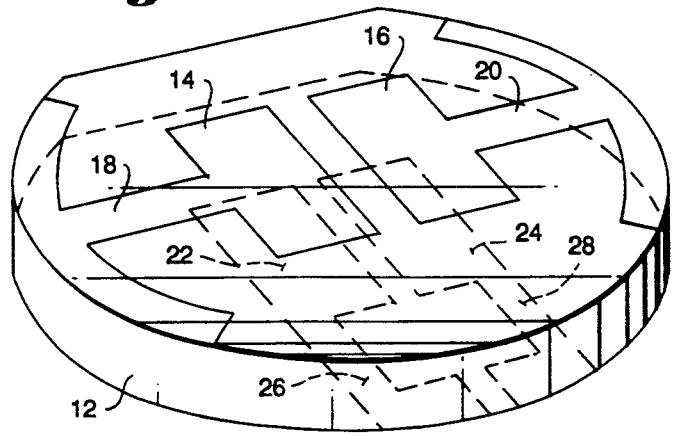
FIG. 1 is a perspective view of a typical coupled-dual resonator crystal.
Figure 2A:
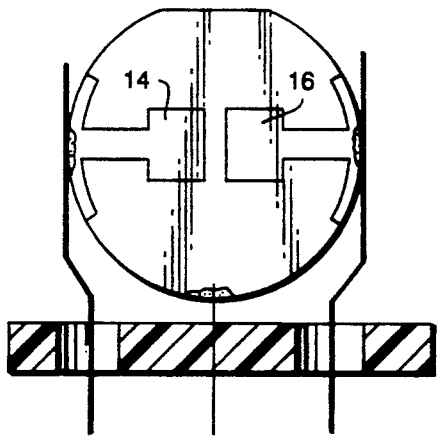
FIGS. 2A and 2B show the active and ground sides of a mounted crystal.
Figure 2B:
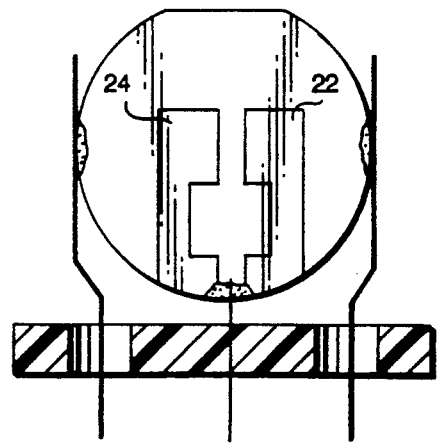
Figure 3:
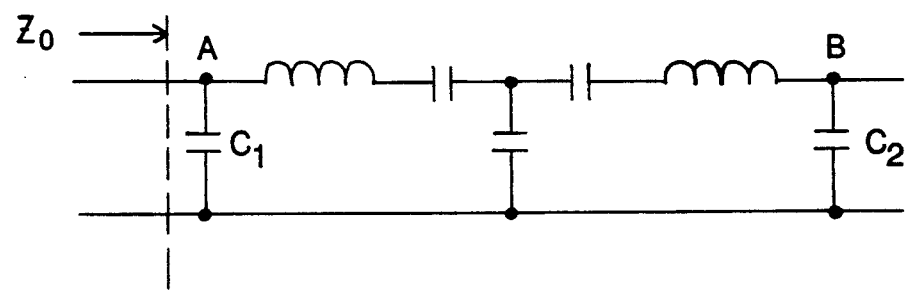
FIG. 3 is a an equivalent circuit of a coupled-dual crystal.
Figure 4:
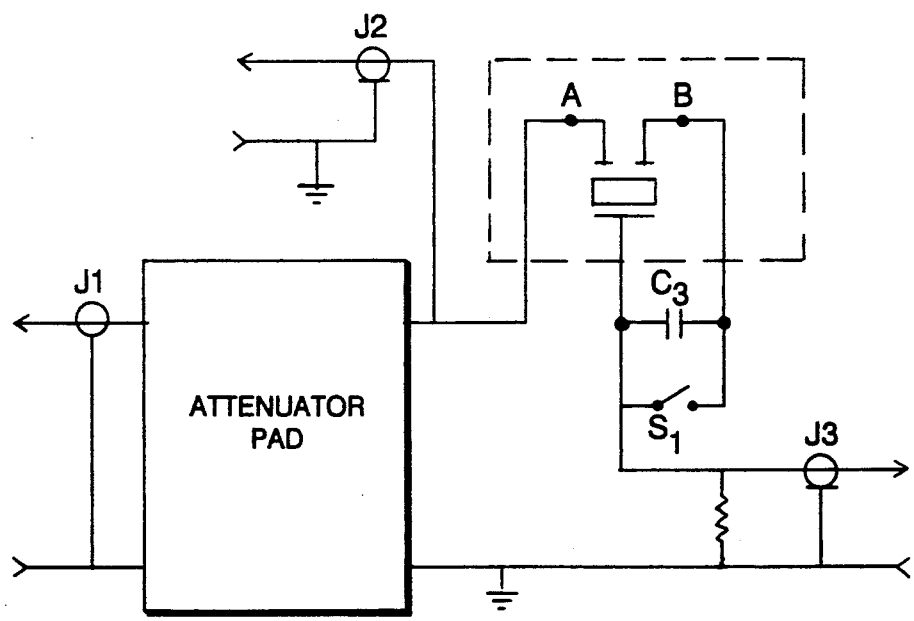
FIG. 4 is an electrical circuit diagram of apparatus for measuring parameters of coupled-dual resonator crystals where the crystal structure is removed after measuring at one port and is reinserted with the ports reversed for subsequent measurements at the other port.
Figure 5A:
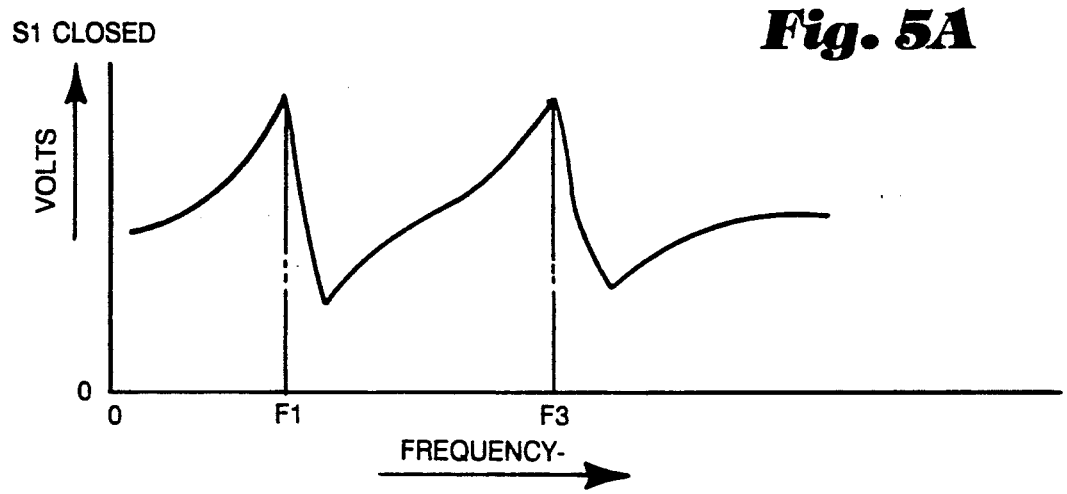
FIGS. 5A and 5B are typical responses for crystal structures under test conditions produced by the apparatus of FIG. 4.
Figure 5B:
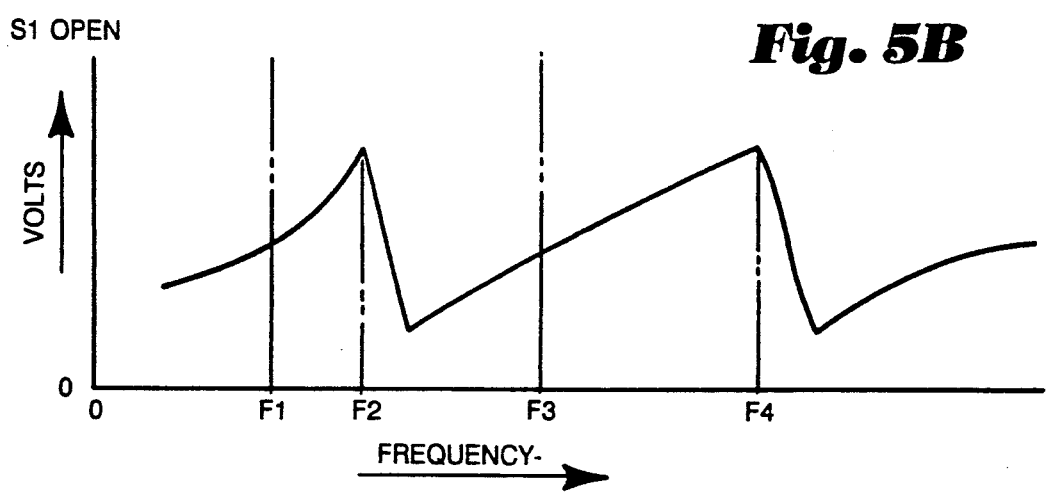
Figures 6, 6A:
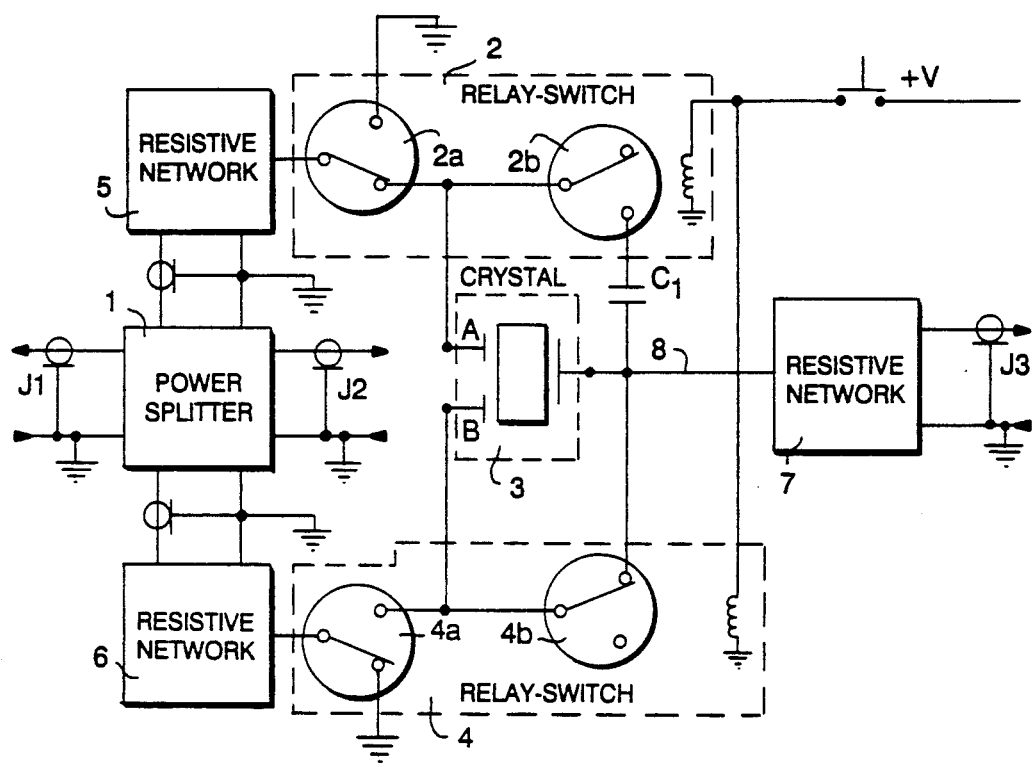
FIG. 6 illustrates a first embodiment for measuring parameters of coupled-dual resonator crystals using both ports and without removing and reversing the crystal structure.
FIG. 6A is a truth table relating to the operation of the apparatus of FIG. 6.

FIG. 6 shows a suitable apparatus for making measurements using conventional transmission or reflection methods. The schematic shows a three output power splitter 1 for directing a signal to three different points: a. to relay switch 2 for port A of the filter 3; b. to relay switch 4 for port B of the filter, and c. to the reference probe (A) of a vector voltmeter (not shown) at J2. If the apparatus is to be used for reflective measurement with an instrument such as the HP 3577A network analyzer (not shown), only a two output power splitter is required and the J2 connection is omitted.

The resistive networks 5, 6 and 7 may be of the type most frequently used for transmission measurement on crystals such as PI-networks as described in International Electrotechnical Commission (IEC) Document No. 444, entitled "Basic Method for Measurement of Resonant Frequency and Equivalent Series Resistance of Quartz Crystal Units by Zero Phase Technique in a PI-network", 1973. Alternatively, the networks may be conventional impedance conversion circuits or attenuator pads. The relay-switches 2 and 4 are radio frequency relays, each with contacts in a double-pole double-throw (2 DPDT) configuration. The arrangement of the relay switches, as illustrated in FIG. 6, is unenergized and is such that the relay windings can be paralleled together and energized from a single power source so as to obtain inverted switch settings and switch between the desired modes. The truth table of FIG. 6A indicates this point. Although the relay switch elements are illustrated as separate units, they may, of course, be consolidated into a single package with appropriate terminals.

For measurement using a vector voltmeter such as a HP 8505A, HP 8508A or other suitable devices for measuring phase and amplitude, the circuit connections are as follows: a frequency synthesizer is connected to J1, the A probe of the vector voltmeter is connected to J2 and the B probe is connected to J3.

To measure F1 and F3, both relays are de-energized as shown in FIG. 6 (Truth Table state 0,0). This allows port A of the crystal to be driven via the first set of contacts 2a of relay-switch 2. The wiper of the second set of contacts 2b of relay-switch 2 is in the normally closed position which has no connection. The first set of contacts 4a of relay-switch 4 are connected such that the wiper is in the normally closed position, which in turn is connected to ground. This effectively grounds the signal present at resistive network 6. The wiper of the second set of contacts 4b of relay-switch 4 is connected to the normally closed position, which in turn is connected to the common lead of the crystal. This shorts port B of the crystal to the common lead 8.

The net effect of having both relays in the de-energized state is to allow port A of the monolithic filter crystal 3 to be excited by the signal source while the other port (B) is shorted to the common lead. This configuration allows measurement of F1 and F3 by the aforementioned frequency sweep techniques.

The circuit configuration for measurement of F2 and F4 is as follows: both relays are energized simultaneously by a suitable power source (Truth Table state 1,1). This allows port B to be driven via the first set of contacts 4a of relay switch 4. The wiper of the second set of contacts 4b of relay-switch 4 are now connected to the normally open position which has no connection.

The first set of contacts 2a of relay-switch 2 now goes to the normally open position which in turn is connected to ground. This prevents the signal present at resistive network 5 from reaching the crystal The wiper of the second set of contacts 2b of relay-switch 2 now goes to the normally open position which in turn is connected to capacitor C1. This puts C1 between the common lead 8 and port A of the crystal.

The net effect of energizing both relays is to allow one port (B, for example) of the monolithic filter crystal to be excited by the signal source while the other port (A) is capacitively coupled to the common lead of the crystal. In some cases the capacitor is omitted and the port is simply left open. This configuration allows for measurement of F2 and F4 using suitable frequency sweep techniques. Once the four frequencies are obtained, the crystal parameters are mathematically derived in the manner taught in U.S. Pat. No. 4,093,914, for example.

FIG. 7 shows an alternate embodiment to the circuit of FIG. 6 with the same reference numbers being assigned to common elements of both embodiments. This embodiment is designed in accordance with the specific implementation of the two-port measurement technique taught in application Ser. No. 07/480,774, now U.S. Pat. No. 5,047,726 and contains substantially the same elements as FIG. 6, such as power splitter 1, radio frequency relays 2 and 4, resistive networks 5, 6 and 7 and capacitor C1. The difference between the two circuits is the inclusion of two coil-capacitor combinations 9 and 10 or—(L1 and C2) and (L2 and C3), respectively, for the purpose of providing a tuned inductance for neutralizing the shunt capacitance of the driving-point impedance of the filter. These compensating impedances are in accordance with the disclosure found in commonly assigned application Ser. No. 07/480,773, now U.S. Pat. No. 5,049,828. However, as will be recognized by the artisan, other reactive networks may be connected to and/or across resonators A and B rather than the arrangement shown in FIG. 7. The Truth Table of FIG. 7A illustrates the manner in which the relays are operated so as to obtain F1, F2, F3 and F4.

Figures 8, 8A:
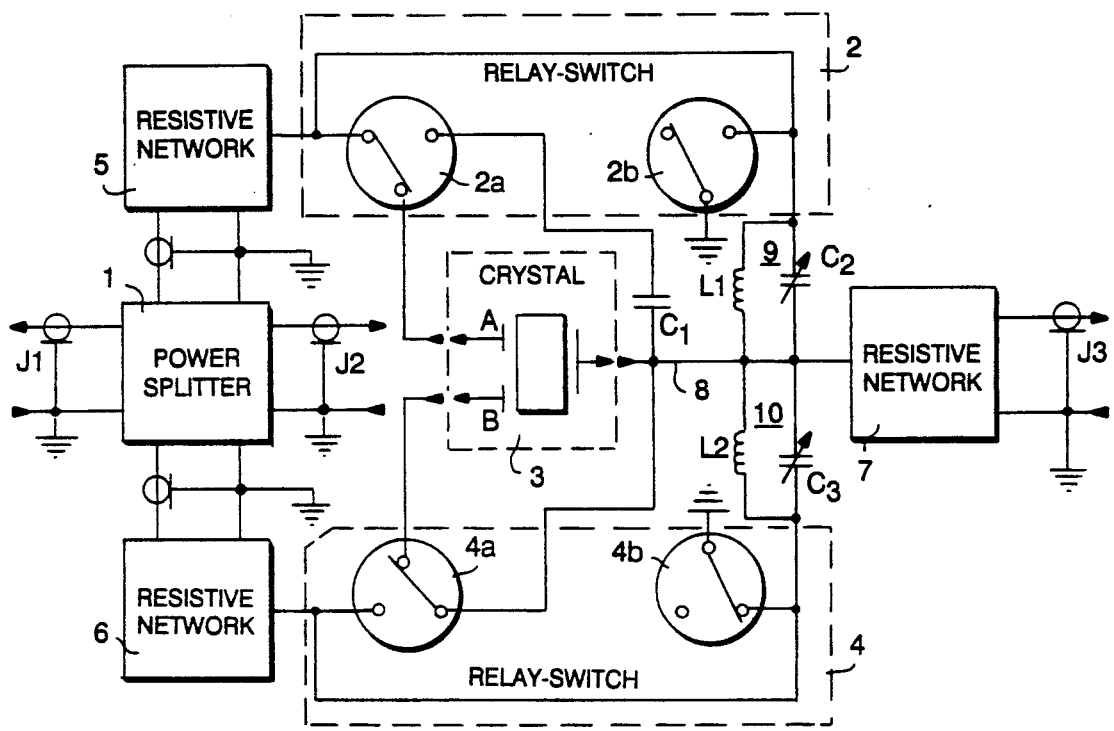
FIG. 8 shows a still further embodiment with a different switching arrangement which allows one of the tuned inductances to be shorted to ground when not required for driving-point impedance compensation.
FIG. 8A is a truth table relating to the operation of the FIG. 8 embodiment.

FIG. 8 differs from FIGS. 6 and 7 by the arrangement of the switches and the interconnections. Again elements common among the embodiments are assigned the same reference numbers. This alternate circuitry allows one of the coil-capacitor combinations 9 or 10 to be shorted to ground when not being used for compensation of the driving-point impedance of the filter. There are no doubt other possible switch arrangements that will provide the same or similar effects as those shown in FIGS. 6, 7 and 8, but such arrangements or modifications are considered to fall within the true intent and scope of the invention.

An exemplary use of this invention is in the development of filter crystal in the 70 MHz range for use in digital cellular telephones. However, the exemplary embodiments disclosed may be used in the manufacture of all high frequency monolithic filter crystals. Such use beneficially results in cost-effectively mass producing monolithic filter crystals for the communications industry.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An improved apparatus for measuring selected parameters of coupled-dual resonator crystals using both resonator ports, which includes a parameter measuring device connected to receive the resonator outputs and a variable frequency signal generator connected in a first mode to one of the resonator ports and connected in a second mode to the other resonator port, the improvement comprising:

first switch means connected to said variable frequency signal generator and to said one resonator port;

second switch means connected to said variable frequency signal generator and to said other resonator port;

said first and second switch means operable in said first mode to apply an output from said variable frequency signal generator to said one resonator port and further operable in said first mode to short-circuit said other resonator port;

said first and second switch means operable in said second mode to apply an output from said variable frequency signal generator to said other resonator port and further operable in said second mode to effectively open-circuit said one resonator port: and means for causing said first and second switch means to operate in said first mode or said second mode, whereby said parameter measuring device sequentially measures said selected parameters in said first and second modes.

2. An apparatus as in claim 1 wherein said first and second switch means comprise radio frequency double-pole double throw relay switches.

3. An apparatus as in claim 1 further comprising:
a tuned reactive impedance connected in circuit with said resonator ports when said first and second switch means are operated in said first and second modes,
whereby the driving point impedance of said resonator ports are compensated such that all zero phase crossing points in a phase versus frequency response can be determined by said measuring device.

4. An apparatus as in claim 1 further comprising:
a first tuned reactive impedance connected to said one resonator port when said first and second switch means are operated in said first mode, and
a second tuned reactive impedance connected to said other resonator port when said first and second switch means are operated in said second mode,
whereby the driving point impedance of said resonator ports are compensated such that all zero phase crossing points in a phase versus frequency response can be determined by said measuring device.

5. An apparatus as in claim 4 wherein said first and second tuned reactive impedances are, respectively, connected in parallel with said one and said other resonator ports in said first and second modes.

6. An apparatus as in claim 5 wherein said first switching means includes means for shorting to ground said first tuned reactive impedance when operated in said second mode, and
said second switching means includes means for shorting to ground said second tuned reactive impedance when operated in said first mode.

7. An apparatus as in claim 1 wherein said first and second switch means are each connected to said signal generator by a power splitter means and an impedance conversion means.

8. An apparatus as in claim 1 wherein said selected parameters are the tuning frequencies of each resonator.

9. An apparatus as in claim 1 wherein said selected parameters are frequencies F1, F2, F3 and F4 which cause maximum voltages to appear at said resonator ports in said first and second modes.

10. A method of measuring selected parameters of coupled-dual resonator crystals using both resonator ports, said method comprising:
connecting both of said dual resonator ports to a variable frequency signal source by way of a switching arrangement;
operating said switching arrangement in a first mode to form a signal path from said source to one of said resonator ports while short-circuiting the other resonator port;
operating said switching arrangement in a second mode to form a signal path from said source to said other resonator port while effectively open circuiting said one resonator port; and
sequentially measuring said selected parameters in said first and second modes.

11. The method of claim 10 further including the step of:
operating said switching arrangement to include a tuned reactive impedance in said signal path in said first and second modes whereby the driving point impedance of said resonator ports are compensated such that all zero phase crossing points in a phase versus frequency response can be determined in said measuring step.

12. The method of claim 11 wherein said tuned reactive impedance includes a first tuned reactive impedance in parallel with said one port and a second tuned reactive impedance in parallel with said other port, said method further including the steps of:
operating said switching arrangement to short circuit said first tuned reactive impedance to ground when in said second mode; and
operating said switching arrangement to short circuit said second tuned reactive impedance to ground when in said first mode.

13. A method as in claim 10 wherein said selected parameters are the tuning frequencies of each resonator.

14. A method as in claim 13 wherein the tuning frequency of each resonator is measured and the method further includes the steps of:
determining the differences between said tuning frequencies; and
adjusting said coupled-dual resonator crystals to exhibit predetermined selected parameter values.

15. A method as in claim 10 wherein said selected parameters are frequencies F1, F2, F3 and F4 which cause substantially maximum voltages to appear at said resonator ports in said first and second modes.

16. A method as in claim 15 wherein said coupled-dual resonator crystals are fine tuned to exhibit selected parameter values based upon the measured values of said frequencies F1, F2, F3 and F4.

* * * * *